US009159381B2

(12) United States Patent
Li et al.

(10) Patent No.: US 9,159,381 B2
(45) Date of Patent: Oct. 13, 2015

(54) TUNABLE REFERENCE CIRCUIT

(75) Inventors: Xia Li, San Diego, CA (US); Jung Pill Kim, San Diego, CA (US); Taehyun Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 832 days.

(21) Appl. No.: 13/464,242

(22) Filed: May 4, 2012

(65) Prior Publication Data

US 2013/0293286 A1 Nov. 7, 2013

(51) Int. Cl.
*G11C 11/00* (2006.01)
*G11C 7/06* (2006.01)
*G11C 11/16* (2006.01)
*G11C 11/56* (2006.01)

(52) U.S. Cl.
CPC .............. *G11C 7/062* (2013.01); *G11C 11/16* (2013.01); *G11C 11/5642* (2013.01)

(58) Field of Classification Search
USPC ...................................... 365/148, 209, 210 A
See application file for complete search history.

(56) References Cited

U.S. PATENT DOCUMENTS

| 6,697,294 | B1 | 2/2004 | Qi et al. | |
|---|---|---|---|---|
| 7,813,166 | B2 | 10/2010 | Jung et al. | |
| 7,881,094 | B2 | 2/2011 | Chen et al. | |
| 7,952,916 | B2 | 5/2011 | Maeda et al. | |
| 2006/0152970 | A1 | 7/2006 | DeBrosse et al. | |
| 2008/0094884 | A1* | 4/2008 | Yang et al. | 365/158 |
| 2009/0201717 | A1* | 8/2009 | Maeda et al. | 365/148 |
| 2009/0323405 | A1 | 12/2009 | Jung et al. | |
| 2010/0091550 | A1 | 4/2010 | Chen et al. | |
| 2010/0208511 | A1 | 8/2010 | Rhie et al. | |
| 2011/0194333 | A1* | 8/2011 | Kim et al. | 365/158 |

FOREIGN PATENT DOCUMENTS

EP 1441438 A1 7/2004
WO 2012011161 A1 1/2012

OTHER PUBLICATIONS

International Search Report and Written Opinion—PCT/US2013/039656—ISA/EPO—Aug. 9, 2013.

* cited by examiner

*Primary Examiner* — Hoai V Ho
(74) *Attorney, Agent, or Firm* — Chui-kiu Teresa Wong; Paul Holdaway

(57) ABSTRACT

A circuit includes a first reference pair that includes a first path and a second path. The first path includes a first magnetic tunnel junction (MTJ) element, and the second path includes a second MTJ element. The circuit further includes a second reference pair that includes a third path and a fourth path. The third path includes a third MTJ element, and the fourth path includes a fourth MTJ element. The first reference pair and the second reference pair are tied together in parallel. A reference resistance of the circuit is based on a resistance of each of the first, second, third, and fourth MTJ elements. The reference resistance of the circuit is adjustable by adjusting a resistance of one of the MTJ elements.

36 Claims, 8 Drawing Sheets

TUNABLE REFERENCE CIRCUIT

I. FIELD

The present disclosure is generally related to adjusting a reference resistance of a reference circuit.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. These wireless telephones may also include memory devices that include magnetic tunnel junction (MTJ) memory elements.

An MTJ memory element limy be used, for example, as a magnetic random access memory (MRAM) element of an MRAM device. An MTJ memory element may be in a parallel state or in an anti-parallel state. Each state of an MTJ memory element may correspond to a respective resistance of the MTJ memory element. A resistance of MTJ memory element that is low relative to a reference resistance may represent a first digital value. A resistance of the MTJ memory element that is high relative to the reference resistance may represent a second digital value. Whether a resistance of an MTJ memory element represents the first digital value or the second digital value may be determined by comparing an output voltage of the MTJ memory element to a reference voltage corresponding to the reference resistance. The output voltage of the MTJ element may correspond to the resistance of the MTJ memory element. Factors such as process variations and manufacturing defects may cause variations in the resistance of the MTJ memory element as well as in the reference resistance. Such resistance variations may result in inconsistent and inaccurate determination of a digital value represented by an output voltage of an MTJ memory element.

III. SUMMARY

A tunable reference circuit that provides a reference voltage is disclosed. The tunable reference circuit may provide a reference voltage to a sensing device (e.g., a sense amplifier) that uses the reference voltage to determine a digital value corresponding to an output voltage of a memory element, such as an MTJ element in an MRAM device. The reference voltage may correspond to a reference resistance of the tunable reference circuit, and the output voltage of the memory element may correspond to a resistance of the memory element.

The tunable reference circuit may include multiple reference pairs that are tied together in parallel and contribute to the reference resistance of the tunable reference circuit. Each reference pair may include a pair of paths that may also be tied together in parallel within each respective reference pair. Each path in a reference pair may include an MTJ element that is selectively adjustable to be in a parallel state or in an anti-parallel. The parallel state of the MTJ element may correspond to a low resistance (Rp) of the MTJ element, and the anti-parallel state of the MTJ element may correspond to a high resistance (Rap) of the MTJ element. The reference resistance of the tunable reference circuit may be adjusted higher or lower by setting the number of MTJ elements that are in parallel state to be different from the number of MTJ elements that are in an anti-parallel state. Adjustment of the reference resistance correspondingly adjusts a reference voltage that is based on the reference resistance. Unequal numbers of MTJ elements in a parallel state and in an anti-parallel state may compensate for process variations and manufacturing defects that affect the reference resistance of the tunable reference circuit and a resistance of an MTJ memory element.

In a particular embodiment, a method of tuning a tunable reference circuit includes selecting a path of a first reference pair of a plurality of reference pairs tied together in parallel. Each of the reference pairs includes a first path including a first magnetic tunnel junction (MTJ) element and a second path including a second MTJ element. The method also includes applying current to the selected path to set an MTJ resistance of an MTJ element in the selected path of the first reference pair. A reference resistance of the tunable reference circuit is based on a resistance of each reference pair of the plurality of reference pairs. The plurality of reference pairs includes a first number of MTJ elements that are in a first state (e.g., parallel state) and a second number of MTJ elements that are in a second state (e.g., anti-parallel state), where the first number and the second number are different.

In another particular embodiment, a circuit includes a first reference pair that includes a first path and a second path. The first path includes a first magnetic tunnel junction (MTJ) element and the second path includes a second MTJ element. The circuit also includes a second reference pair that includes a third path and a fourth path. The third path includes a third MTJ element and the fourth path includes a fourth MTJ element. The first reference pair and the second reference pair are tied together in parallel. A reference resistance of the circuit is based on a resistance of each of the first, second, third, and fourth MTJ elements. The reference resistance of the circuit is adjustable by adjusting a resistance of one of the first and second MTJ elements.

In another particular embodiment, an apparatus includes means for selecting a path of a first reference pair of a plurality of reference pairs tied together in parallel. Each of the reference pairs includes a first path that includes a first magnetic tunnel junction (MTJ) element and a second path that includes a second MTJ element. The apparatus also includes means for applying current to the selected path to set an MTJ resistance of an MTJ element in the selected path of the first reference pair. A reference resistance of the tunable reference circuit is based on a resistance of each reference pair of the plurality of reference pairs. The plurality of reference pairs includes a first number of MTJ elements that are in a first state and a second number of MTJ elements that are in a second state, where the first number and the second number are different.

One particular advantage provided by at least one of the disclosed embodiments is adjustment of a reference resistance corresponding to a reference voltage that is used to determine a digital value associated with a resistance of an MTJ memory element. Adjustment of a reference resistance may improve reliability of a digital value that is determined based on a comparison of an output voltage of the MTJ memory element to the reference voltage. Further, adjustment of a reference resistance may improve manufacturing yield of a memory device including memory MTJ elements by compensating for process variations and manufacturing defects that affect the reference resistance and the resistance of MTJ memory elements. To illustrate, reference pairs may be tied together in parallel to form a common reference circuit that may be used as a reference voltage source for multiple memory elements of a memory device. Because of parasitic routing resistance, a reference voltage level at a first location on a reference voltage line may be different from a reference voltage level at a second location on the reference voltage line. Additionally, due processing variations, an MTJ memory element at a first location within a memory device may have a resistance that is different from a resistance of another MTJ memory element at a second location within the memory device. Thus, adjusting the reference voltage provided by the common reference circuit based on spatial locations of memory elements and of reference pairs may compensate for parasitic routing resistance and variations in resistances of MTJ memory elements.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
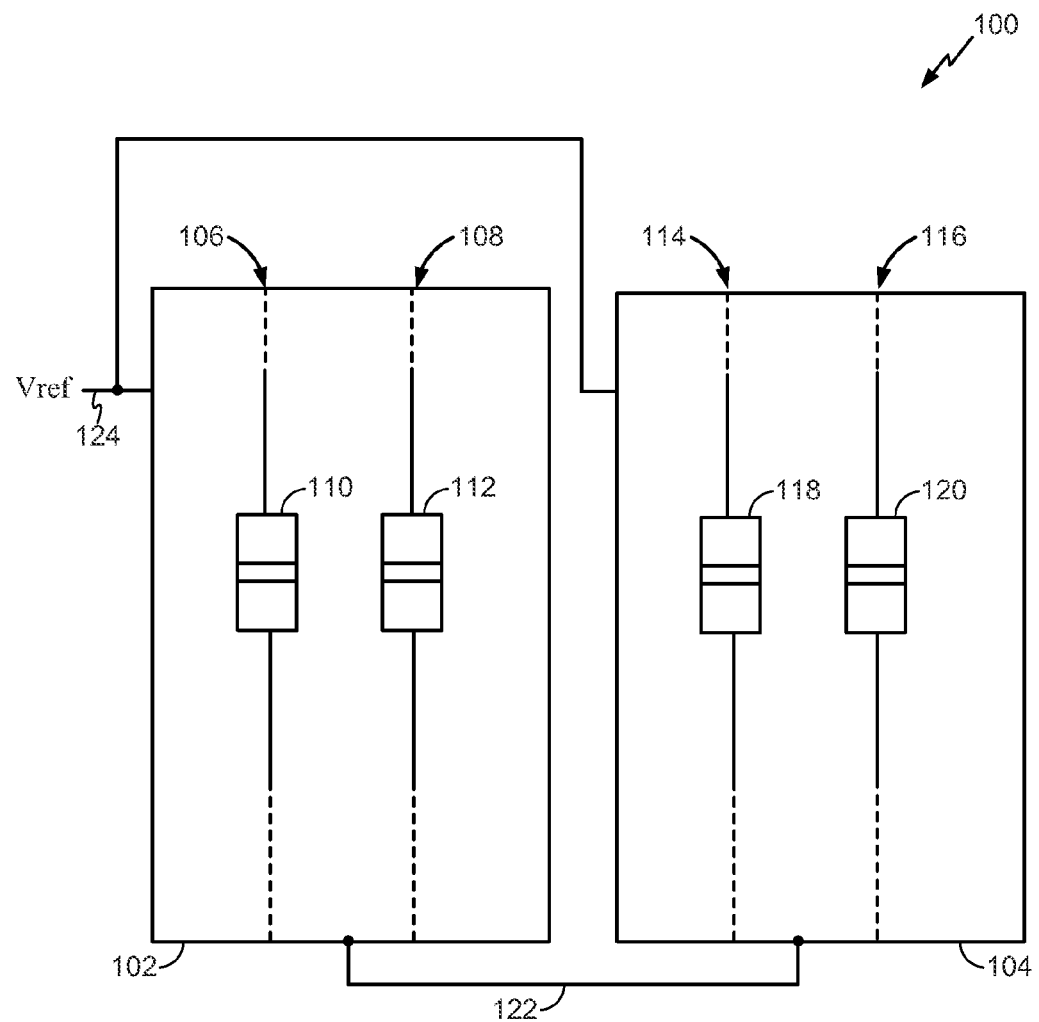
FIG. 1 is a block diagram of a particular illustrative embodiment of a tunable reference circuit.

Referring to FIG. 1, a particular illustrative embodiment of a tunable reference circuit is depicted and generally designated 100. The tunable reference circuit 100 includes a first reference pair 102 and a second reference pair 104. The first reference pair 102 and the second reference pair 104 are tied together in parallel via a reference voltage line 124 and a line 122. The tunable reference circuit 100 may have a reference resistance at the reference voltage line 124 that is based on a resistance of the first reference pair 102 and a resistance of the second reference pair 104. For example, the reference resistance of the tunable reference circuit 100 may be an average of the resistances of the first reference pair 102 and the second reference pair 104. The tunable reference circuit 100 may have a reference voltage (Vref) on the reference voltage line 124 that is based on the reference resistance of the tunable reference circuit 100. The reference voltage (Vref) on the reference voltage line 124 may be adjusted by adjusting the reference resistance of the tunable reference circuit 100. In a particular embodiment, the reference voltage (Vref) on the reference voltage line 124 may be used to determine a digital value corresponding to an output voltage of a memory element, such as a magnetic random access memory (MRAM) element.

From spatial layout point of view, voltage levels of the reference voltage (Vref) at various locations on the reference voltage line 121 may be different from each other due to parasitic routing resistance of the reference voltage line 124. For example, a voltage level of the reference voltage (Vref) at a location that is close to the left side of the first reference pair 102 may be different from a voltage level of the reference voltage (Vref) at another location that is close to the right side of the second reference pair 104. Thus, individually adjusting the resistance of the first reference pair 102 and the resistance of the second reference pair 104 may compensate for the effect of the parasitic routing resistance on the voltage level of the reference voltage (Vref). Additionally, due to processing variations, MTJ memory elements of a memory device that are close to the first reference pair 102 may have resistances that are different from the resistances of MTJ memory elements of the memory device that are close to the second reference pair 104. The differences in the resistances of the memory elements may result in different desirable reference voltage levels for use with the different MTJ elements. Thus, adjusting the reference voltage based on a location of an MTJ memory element of a memory device may compensate for variations in resistances of the MTJ elements.

In a particular embodiment, the first reference pair 102 may include a first path 106 and a second path 108. The first path 106 may include a first MTJ element 110. The second path 108 may include a second MTJ element 112. The resistance of the first reference pair 102 may be based on a resistance of the first MTJ element 110 and a resistance of the second MTJ element 112. To illustrate, the first MTJ element 110 and the second MTJ element 112 may have a low resistance (Rp) or a high resistance (Rap). In a particular embodiment, the low resistance (Rp) may correspond to a first state, and the high resistance (Rap) may correspond to a second state. For example, the first state may correspond to a parallel state of an MTJ element, and the second state may correspond to an anti-parallel state of the MTJ element.

In a particular embodiment, the first MTJ element 110 may be in the parallel state or in the anti-parallel state based on a direction of a write current that passes through the first path 106. Similarly, the second MTJ element 112 may be set in the parallel state or in the anti-parallel state based on a direction of a write current that passes through the second path 108. In a particular embodiment, the resistance of the first reference pair 102 may be an equivalent resistance of the resistance of the first MTJ element 110 and the resistance of the second MTJ element 112 that is in parallel with the first MTJ element 110.

In a particular embodiment, the second reference pair 104 includes a third path 114 and a fourth path 116. The third path 114 includes a third MTJ element 118 and the fourth path 116 includes a fourth MTJ element 120. The resistance of the second reference pair 104 may be based on a resistance of the third MTJ element 118 and a resistance of the fourth MTJ element 120. To illustrate, the third MTJ element 118 and the fourth MTJ element 120 may have the low resistance (Rp) or the high resistance (Rap). The low resistance (Rp) may correspond to the first state, and the high resistance (Rap) may correspond to the second state. For example, the first state may correspond to a parallel state of an MTJ element, and the second state may correspond to an anti-parallel state of the MTJ element.

In a particular embodiment, the third. MTJ element 118 may be in the parallel state or in the anti-parallel state based on a direction of a write current that passes through the third path 114. Similarly, the fourth MTJ element 120 may be set in the parallel state or in the anti-parallel state based on a direction of a write current that passes through the fourth path 116. In a particular embodiment, the resistance of the second reference pair 104 may be an equivalent resistance of the resistance of the third MTJ element 118 and the resistance of the fourth MTJ element 120 that is in parallel with the third MTJ element 118.

In a particular embodiment, the reference resistance of the tunable reference circuit 100 may be based on a resistance of each of the first MTJ element 110, the second MTJ element 112, the third MTJ element 118, and the fourth MTJ element 120. For example, the reference resistance of the tunable reference circuit 100 may be adjustable by adjusting a resistance of one or more of the first MTJ element 110 and the second MTJ element 112. The reference resistance of the tunable reference circuit 100 may also be adjustable by adjusting a resistance of one or more of the third MTJ element 118 and the fourth MTJ element 120.

In a particular embodiment, a number of the MTJ elements 110, 112, 118, 120 that are in a first state (e.g., the parallel state) may be different from a number of the MTJ elements 110, 112, 118, 120 that are in a second state (e.g., the anti-parallel state). To illustrate, the first MTJ element 110 and the second MTJ element 112 may be adjusted to be in the same state as each other and the third MTJ element 118 may be adjusted to be in a different state from the fourth MTJ element 120. In a particular embodiment, the first MTJ element 110, the second MTJ element 112, and the third MTJ element 118 may be adjusted to be in the parallel state, and the fourth MTJ element 120 may be adjusted to be in the anti-parallel state. Alternatively, in another embodiment, a number of the MTJ elements 110, 112, 118, 120 that are in a first state (e.g., the parallel state may be equal to a number of the MTJ elements 110, 112, 118, 120 that are in a second state (e.g., the anti-parallel state).

During operation, the reference voltage (Vref) on the reference voltage line 124 may be adjusted higher or lower by adjusting the reference resistance of the tunable reference circuit 100 higher or lower, respectively. The reference resistance of the tunable reference circuit 100 may be adjusted by adjusting the state of one or more of the first MTJ element 110, the second MTJ element 112, the third. MTJ element 118, and the fourth MTJ element 120. For example, the resistance of one or more of the first, second, third, and fourth MTJ elements 110, 112, 118, 120 may be adjusted such that a number of the first, second, third, and fourth MTJ elements 110, 112, 118, 120 in the first state is different from a number of the first, second, third, and fourth MTJ elements 110, 112, 118, 120 in the second state. To illustrate, a respective write current may be supplied to each of the first path 106, the second path 108, the third path 114, and the fourth path 116. Each of the first MTJ element 110, the second MTJ element 112, the third MTJ element 118, and the fourth MTJ element 120 may be set to be in the parallel state or in the anti-parallel state based on a direction of the respective write current. For example, the first MTJ element 110, the second MTJ element 112, and the third MTJ element 118 may be configured to be in a parallel state corresponding to the low resistance (Rp) and the fourth MTJ element 120 may be configured to be in the anti-parallel state corresponding to the high resistance (Rap).

Following the adjustment of the reference resistance of the tunable reference circuit 100, the reference voltage (Vref) corresponding to the reference resistance of the tunable reference circuit 100 may be used to determine a digital value corresponding to an output voltage of an MTJ memory element that is based on a resistance of the MTJ memory element. A respective read current may be applied to a source line or a bit line of a memory element and to each of the first path 106, the second path 108, the third path 114, and the fourth path 116. The output voltage of the MTJ memory element may be compared to the reference voltage (Vref) corresponding to the reference resistance of the tunable reference circuit 100 to determine the digital value corresponding to the output voltage of the MTJ memory element.

By adjusting a resistance of one or more of the first MTJ element 110, the second MTJ element 112, the third MTJ element 118, and the forth MTJ element 120, the reference resistance of the tunable reference circuit 100 may be adjusted higher or lower. The reference voltage (Vref) may be correspondingly adjusted higher or lower as a result of adjusting the reference resistance of the tunable reference circuit 100. Adjustment of the reference voltage (Wet) may improve the sensing margin of a sense amplifier and reliability of a digital value that is determined as corresponding to an output voltage of an MTJ memory element based on the output voltage of the MTJ memory element and the reference voltage (Vref). In addition, manufacturing yield of memory devices that include the MTJ memory element may be improved as a result of compensating for process variations and manufacturing defects by adjusting the reference resistance of the tunable reference circuit 100. Additionally, because of parasitic routing resistance, the reference voltage (Vref) may have different voltage levels at various locations on the reference voltage line 124. To overcome effects of parasitic routing resistance, a voltage level of the reference voltage (Vref) at a particular location on the reference voltage line 124 may be preferably adjusted by changing the resistance of a reference pair that is close to the particular location. Further, due to processing variations, MTJ memory elements at different locations within a memory device may have different resistances. Accordingly, voltage levels of the reference voltage (Vref) at different locations on the reference voltage line 124 may be adjusted to compensate for variations in resistances of MTJ memory elements that are close to particular locations on the reference voltage line 124. Thus, the sensing margin of a sense amplifier may be improved by adjusting the reference voltage based on spatial location of an MTJ memory element of a memory device.

To illustrate, adjusting the resistance of one or more of the first, second, third, and fourth MTJ elements 110, 112, 118, 120 such that the number of the first, second, third, and fourth MTJ elements 110, 112, 118, 120 in the first state is different from the number of the first, second, third, and fourth MTJ elements 110, 112, 118, 120 in the second state has a number of technical advantages.

For example, an initial configuration of the tunable reference circuit 100 may include reference pairs 102. 104, where each reference pair includes an MTJ element that is in a parallel state and an MTJ element that is in anti-parallel state. The reference resistance of the tunable reference circuit 100 may be an average of the resistance of each reference pair 102, 104, and the resistance of each particular pair may be an equivalent resistance of a resistance of each of the two MTJ elements that are tied together in parallel in the particular pair. Such a configuration may provide a reference resistance of the tunable reference circuit that is desirably close to halfway between a high resistance of an MTJ memory element and a low resistance of the MTJ memory element. However, due to factors such as process variations and manufacturing defects, the reference resistance of the tunable reference circuit may be, for example, closer to either a high resistance of the MTJ memory element or to a low resistance of the MTJ memory. Such deviations from a desirable relationship between the reference resistance of the tunable reference circuit 100 and a resistance of the MTJ memory element may impact reliable determination (sensing) of a digital value that corresponds to the resistance of the MTJ memory element. Unreliability of determined digital values may adversely impact manufacturing yield of a memory device that includes the MTJ memory element.

By selecting a path in a reference pair of a tunable reference circuit and adjusting the resistance of an MTJ element in the selected path to a low resistance (e.g., a low resistance corresponding to a first state such as a parallel state) or a high resistance (e.g. a high resistance corresponding to a second state such as an anti-parallel state), a resistance of the reference pair may be adjusted lower or higher. The adjustment of the resistance of the MTJ element in the selected path may correspondingly adjust the reference resistance of the tunable reference circuit such that the reference resistance is balanced between a high resistance and a low resistance of the MTJ element. An adjustment of a resistance of an MTJ element in the selected path of a reference pair may result in the reference pair having both MTJ elements in a parallel state or in an anti-parallel state and in the tunable reference circuit having unequal numbers of MTJ elements in the parallel state and MTJ elements in the anti-parallel state. Thus, a tunable reference circuit that has unequal numbers of MTJ elements in a parallel state and MTJ elements in an anti-parallel state may have a reference resistance that is desirably balanced between a high resistance of the MTJ memory element and a low resistance of the MTJ memory element such that reliability of digital values that are determined (sensed) based on the resistance of the MTJ memory element is improved. Improvements in the reliability of digital values determined (sensed) based on the resistance of the MTJ memory element may result in improved manufacturing yield.

Although FIG. 1 illustrates two reference pairs, 102, 104 in the tunable reference circuit 100, the tunable reference circuit 100 may have greater than or less than two reference pairs. In addition, each of the first path 106, the second path 108, the third path 114, and the fourth path 116 may have one or more MTJ elements in series with the first MTJ element 110, the second MTJ element 112, the third MTJ element 118, and the fourth MTJ element 120, respectively.

Figure 2:
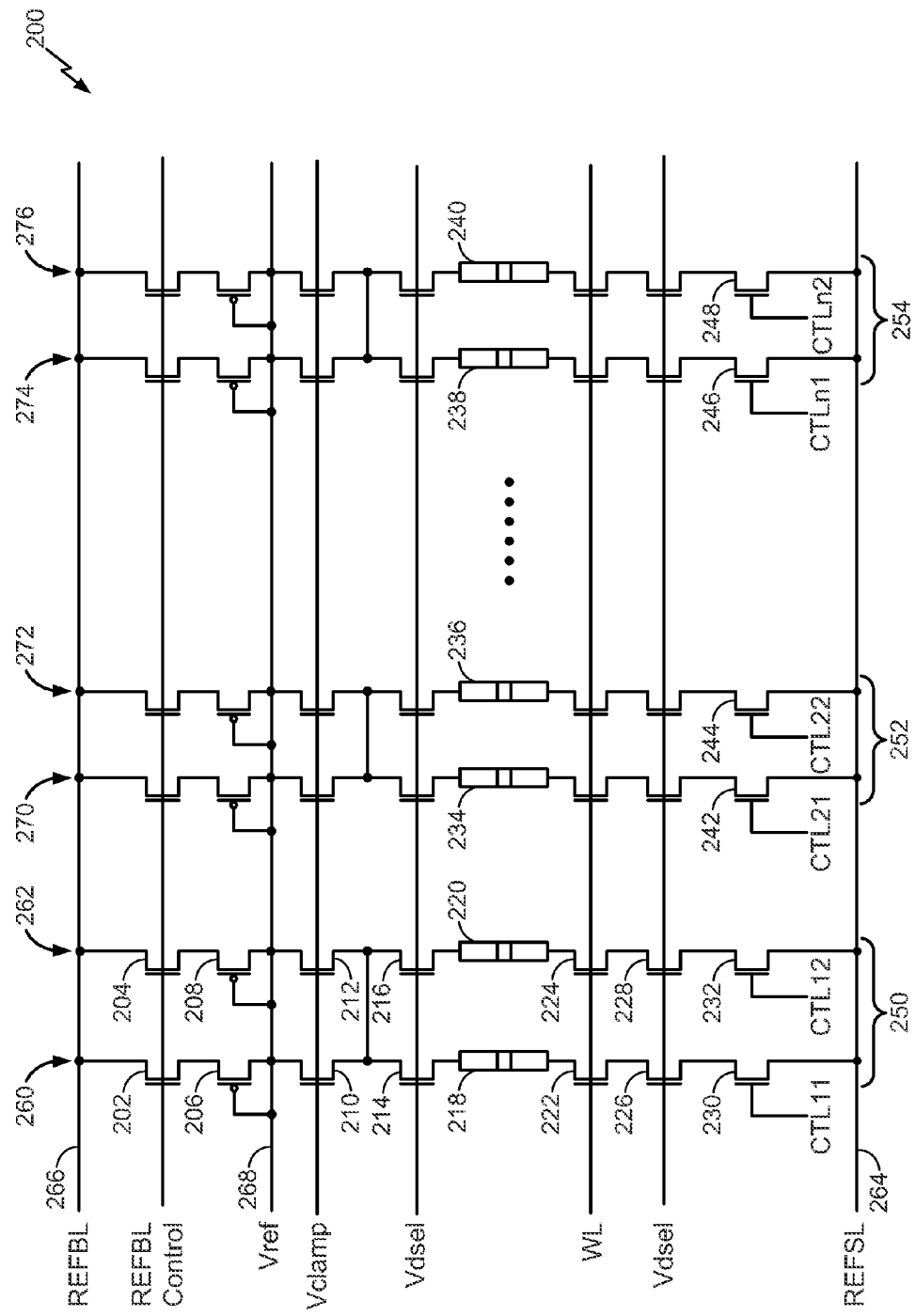
FIG. 2 is a circuit diagram of a particular illustrative embodiment of the tunable reference circuit.

Referring to FIG. 2, a particular illustrative embodiment of a tunable reference circuit is depicted and generally designated 200. The tunable reference circuit 200 may provide a reference voltage (Vref) that is based on a reference resistance of the tunable reference circuit 200 for use in determining a digital value corresponding to an output voltage of a memory element. The tunable reference circuit 200 may include a first reference pair 250, a second reference pair 252, and an nth reference pair 254. The first reference pair 250, the second reference pair 252, and the nth reference pair 254 may be tied together in parallel. The first reference pair 250, the second reference pair 252, and the nth reference pair 254 may be tied together via a reference voltage line at the reference voltage (Vref) 268, a reference bit line signal (REFBL) at the reference bit line 266, and a reference source line 264 that is configured to carry a reference source line signal (REFSL). In a particular embodiment, the first reference pair 250 and the second reference pair 252 may correspond to the first reference pair 102 and to the second reference pair 104 of FIG. 1, respectively.

In a particular embodiment, the reference resistance of the tunable reference circuit 200 at the reference voltage line 268 may be based on a resistance of each of the first reference pair 250, the second reference pair 252, and the nth reference pair 254. For example, the reference resistance of the tunable reference circuit 200 may be an average of the resistance of each of first reference pair 250, the second reference pair 252, and an nth reference pair 254. The reference resistance of the tunable reference circuit 200 may be adjusted by adjusting a resistance of one or more of the first reference pair 250, the second reference pair 252, and an nth reference pair 254. In a particular embodiment, the reference voltage (Vref) on the reference voltage line 268 may be changed by adjusting the reference resistance of the tunable reference circuit 200.

In a particular embodiment, the reference resistance of the tunable reference circuit 200 may be adjusted by adjusting a resistance of the first reference pair 250. The first reference pair 250 may include a first path 260 and a second path 262. The first path 260 may include a first MTJ element 218 and a first transistor 230. The first MTJ element 218 may be coupled to a word line transistor 222 and to a first data select transistor 214. A voltage clamp transistor 210 may be coupled to the first data select transistor 214 and to a load transistor 206. In a particular embodiment, the load transistor 206 may be op-channel metal-oxide-semiconductor (PMOS) transistor. A drain terminal and a gate terminal of the load transistor 206 may be coupled to the reference voltage line 268. The load transistor 206 may be coupled to a source terminal of a reference bit line control transistor 202. The drain terminal of the bit line control transistor 202 may be coupled to the reference bit line 266. The word line transistor 222 may be coupled to a second data select transistor 226 that is coupled to a drain terminal of the first transistor 230. The source terminal of the first transistor 230 may be coupled to the reference source line 264.

In a particular embodiment, at least one control signal may be asserted to enable adequate current to flow through the first MTJ element 218. For example, a word line signal (WL), a data select signal (Vdsel), a voltage clamp signal (Vclamp), a reference bit line control signal (REFBL control), and the first reference source line control signal (CTL11) may be asserted to enable adequate current to flow through the first MTJ element 218.

In a particular embodiment, the first path 260 may be selected by asserting a first reference source line control signal (CTL11) that is provided to a gate terminal of the first transistor 230. The first path 260 may be configured to receive a current to set an MTJ resistance of the first MTJ element 218. For example, after selecting the first path 260 by asserting the first reference source line control signal (CTL11), a write current may be applied to the selected first path 260 to set the MTJ resistance of the first MTJ element 218. In an alternative embodiment, the first path 260 may be selected by asserting the first reference source line control signal (CTL11) after or substantially simultaneously with applying the write current to the first path 260.

In a particular embodiment, the first path 260 may be configured to receive the write current via the reference bit line 266 or via the reference source line 264. For example, the first path 260 may be configured to receive the write current via the reference bit line 266 to set the first MTJ element 218 in a first state. The first path 260 may also be configured receive the write current via the reference source line 264 to set the first MTJ element 218 in a second state.

In a particular embodiment, a first resistance of the first MTJ element 218 may correspond to the first state, and a second resistance of the first MTJ element 218 may correspond to the second state. To illustrate, the first state may correspond to a parallel state of the first MTJ element 218, and the second state may correspond to an anti-parallel state of the first MTJ element 218. In a particular embodiment, the second resistance may be greater than the first resistance. For example, the first resistance may correspond to a low resistance (Rp), and the second resistance may correspond to a high resistance (Rap).

In a particular embodiment, the second path 262 may include a second MTJ element 220 and a first transistor 232. The second MTJ element 220 may be coupled to a word line transistor 224 and to a first data select transistor 216. A source terminal of a voltage clamp transistor 212 may be coupled to a source terminal of the voltage clamp transistor 210 of the first path 260. The voltage clamp transistor 212 may also be coupled to the first data select transistor 216 and to a load transistor 208. Lou particular embodiment, the load transistor 208 may be a PMOS transistor. A drain terminal and a gate terminal of the load transistor 208 may be coupled to the reference voltage line 268. The load transistor 208 may be coupled to a source terminal of a reference bit line control transistor 204. The drain terminal of the reference bit line control transistor 204 may be coupled to the reference bit line 266. The word line transistor 224 may be coupled to a second data select transistor 228 that is coupled to a drain terminal of a second transistor 232. The source terminal of the second transistor 232 may be coupled to the reference source line 264.

In a particular embodiment, the second path 262 may be configured to receive a write current to set the MTJ resistance of the second MTJ element 220. For example, the second path 262 may be configured receive the write current via the reference bit line 266 to set the second MTJ element 220 in a first state and to receive the write current via the reference source line 264 to set the second MTJ element 220 in a second state. In a particular embodiment, the second path 262 may be selected by asserting a second reference source line control signal (CTL12) that is provided to gate terminal of the second transistor 232.

In a particular embodiment, the first state may correspond to a parallel state of the second MTJ element 220 corresponding to a first resistance of the second MTJ element 220, and the second state may correspond to an anti-parallel state of the second MTJ element 220 corresponding to a second resistance of the second MTJ element 220. To illustrate, the first resistance may be greater than the second resistance. For example, the first resistance may correspond to a low resistance (Rp), and the second resistance may correspond to a high resistance (Rap).

In a particular embodiment, the control signal may be asserted to enable current to flow through the second MTJ element 220. For example, the word line signal (WL), the data select signal (Vdsel), the voltage clamp signal (Vclamp), the reference bit line control signal (REFBL control), and the second reference source line control signal (CTL12) may be asserted to enable adequate current to flow through the second MTJ element 220.

In a particular embodiment, after selecting the second path 262 by asserting the second reference source line control signal (CTL12), a write current may be applied to the selected second path 262 to set the resistance of the second MTJ element 220. In an alternative embodiment, the second path 262 may be selected by asserting the second signal (CTL12) after or substantially simultaneously with applying the write current to the second path 262.

In a particular embodiment, the reference resistance of the tunable reference circuit 200 may be adjusted by adjusting a resistance of the second reference pair 252. The second reference pair 252 may have a similar structure as the first reference pair 250. For example, the second reference pair 252 may have a first path 270 and a second path 272. The second reference pair 252 may have a first MTJ element 234 in the first path 270 and a second MTJ element 236 in the second path 272. A third reference source line control signal (CTL21) may be provided to a gate terminal of a first transistor 242 in the first path 270 of the second reference pair 252. A fourth reference source line control signal (CTL22) may be provided, to a gate terminal of a second transistor 244 of the second path 272 of the second reference pair 252. The first path 270 of the second reference pair 252 may be selected by asserting the reference source line control signal (CTL21). Similarly, the second path 272 of the second reference pair 252 may be selected by asserting the reference source line control signal (CTL22). The first path 270 may be configured to receive a current to set an MTJ resistance of the first MTJ element 234 in a similar manner as described with respect to the first path 260 in the first reference pair 250. The second path 272 may be configured to receive a current to set an MTJ resistance of the second MTJ element 236 in a similar manner as described with respect to the second path 262 in the first reference pair 250.

In a particular embodiment, the reference resistance of the tunable reference circuit 200 may be adjusted by adjusting a resistance of the nth reference pair 254. The nth reference pair 254 has a similar structure as the first reference pair 250 and, the second reference pair 252. For example, a first path 274 of the nth reference pair 254 may include a first NTH element 238 and a first transistor 246. A second path 276 of the nth reference pair 254 may include a second, km element 240 and a second transistor 248. The first path 274 of the nth reference pair 254 may be selected by asserting a fifth reference source line control signal (CTLn1) that is provided to a gate terminal of the first transistor 246. Similarly, the second path 276 of the nth reference pair 254 may be selected by asserting a reference source line control signal (CTLn2) that is provided to a gate terminal of the second transistor 248. The first path 274 may be configured to receive a current to set an MTJ resistance of the first MTJ element 238 in a similar manner as described with respect to the first path 260 in the first reference pair 250. The second path 276 may be configured to receive a current to set an MTJ resistance of the second MTJ element 240 in a similar manner as described with respect to the second path 262 in the first reference pair 250.

During operation, the reference resistance of the tunable reference circuit 200 may be adjusted by adjusting the resistance of one or more of the first reference pair 250, the second reference pair 252, and the nth reference pair 254. In a particular embodiment, the reference resistance of the tunable reference circuit 200 is adjusted after a test (e.g., a self-test) is performed on the tunable reference circuit 200 to determine initial resistance of the tunable reference circuit 200. For example, the resistance of one or more of the first reference pair 250, the second reference pair 252, and the nth reference pair 254 may be adjusted such that a number of MTJ elements having a low resistance (Rp) is different from a number of MTJ elements having a high resistance (Rap). Due to parasitic routing resistance, each reference pair 250, 252, 254 may affect the reference voltage (Vref) differently at a particular location on the reference voltage line 268. Additionally, the resistances of the reference pairs 250, 252, and 254 may be different from each other due to processing variations. Thus, an algorithm for tuning a specific reference pair based on spatial location of each reference pair 250, 252, 254 and variations in resistances of the reference pairs 250, 252, and 254 may improve a sensing margin of a sense amplifier.

To illustrate, the resistance of the first reference pair 250 may be adjusted to adjust the reference resistance of the tunable reference circuit 200. To adjust the resistance of the first reference pair 250, the first reference source line control signal (CNTL11) may be asserted to select the first path 260. The word line signal (WL), the data select signal (Vdsel), the voltage clamp signal (Vclamp), and the reference bit line control signal (REFBL control) may be asserted to turn on the word line transistor 222, the data select transistors 214, 226, the voltage clamp transistor 210, and the bit line control transistor 202, respectively. Turning on the word line transistor 222, the data select transistors 214, 226, the voltage clamp transistor 210, and the bit line control transistor 202 enables a write current to flow through the first MTJ element 218 to set the resistance of the first MTJ element 218. The write current may be applied to the reference bit line 266 to set the resistance of the first MTJ element 218 to a low resistance (Rp) or to a high resistance (Rap). Alternatively, the write current may be applied to the reference source line 264 to set the resistance of the first element 218 to a low resistance (Rp) or to a high resistance (Rap).

Following the adjustment of the reference resistance of the tunable reference circuit 200, the reference voltage (Vref) corresponding to the reference resistance of the tunable reference circuit 200 may be used to determine (sense) a digital value corresponding to an output voltage of an MTJ memory element. A respective read current may be applied to the reference source line 264 and to a source line of a memory element. Alternatively, a respective read current may be applied to the reference bit line 266 and to a bit line of the memory element. The output voltage of the MTJ memory element may be compared to the reference voltage (Vref) to determine (sense) the digital value corresponding to the output voltage of the MTJ memory element.

By adjusting the resistance of one or more of the first reference pair 250, the second reference pair 252, and the nth reference pair 254, the reference resistance of the tunable reference circuit 200 may be adjusted higher or lower. The reference voltage (Vref) may be correspondingly adjusted higher or lower as a result of adjusting the reference resistance of the tunable reference circuit 200. Adjustment of the reference voltage (Vref) may improve the reliability of a digital value corresponding to an output voltage of an MTJ memory element that is determined (sensed) based on the output voltage of the MTJ memory element and the reference voltage (Vref). By adjusting a resistance of a specific reference pair, overall reference resistance of the tunable reference circuit 200 and the reference resistance at a particular location on the reference voltage line may be tuned to increase sensing margin for all MTJ elements in a memory device as well as for particular MTJ memory elements in the memory device. In addition, manufacturing yield of memory devices that include the MTJ memory element may be improved as a result of compensating for process variations and manufacturing defects by adjusting the reference resistance of the tunable reference circuit 200.

Although FIG. 2 illustrates three reference pairs 250, 252, 254, the tunable reference circuit 200 may include greater than or less than three reference pairs, in addition, although the operation of adjusting the reference resistance of the tunable reference circuit 200 is described with respect to the first reference pair 250, the resistance of each of the second reference pair 252 and the nth reference pair 254 may be adjusted in a similar manner as described with respect to the first reference pair 250 to adjust the reference resistance of the tunable reference circuit 200. Further, the resistance of the first reference pair 250 may also be adjusted by adjusting the resistance of the second MTJ element 220 in a similar manner as described with respect to the first MTJ element 218. Adjusting a specific reference pair based on an optimizing algorithm may improve overall sensing margin for all NTH elements in a memory device and also improve sensing margin for particular MTJ memory elements in the memory device. Such improvements in sensing margin may improve manufacturing yield of MRAM devices.

Figure 3:
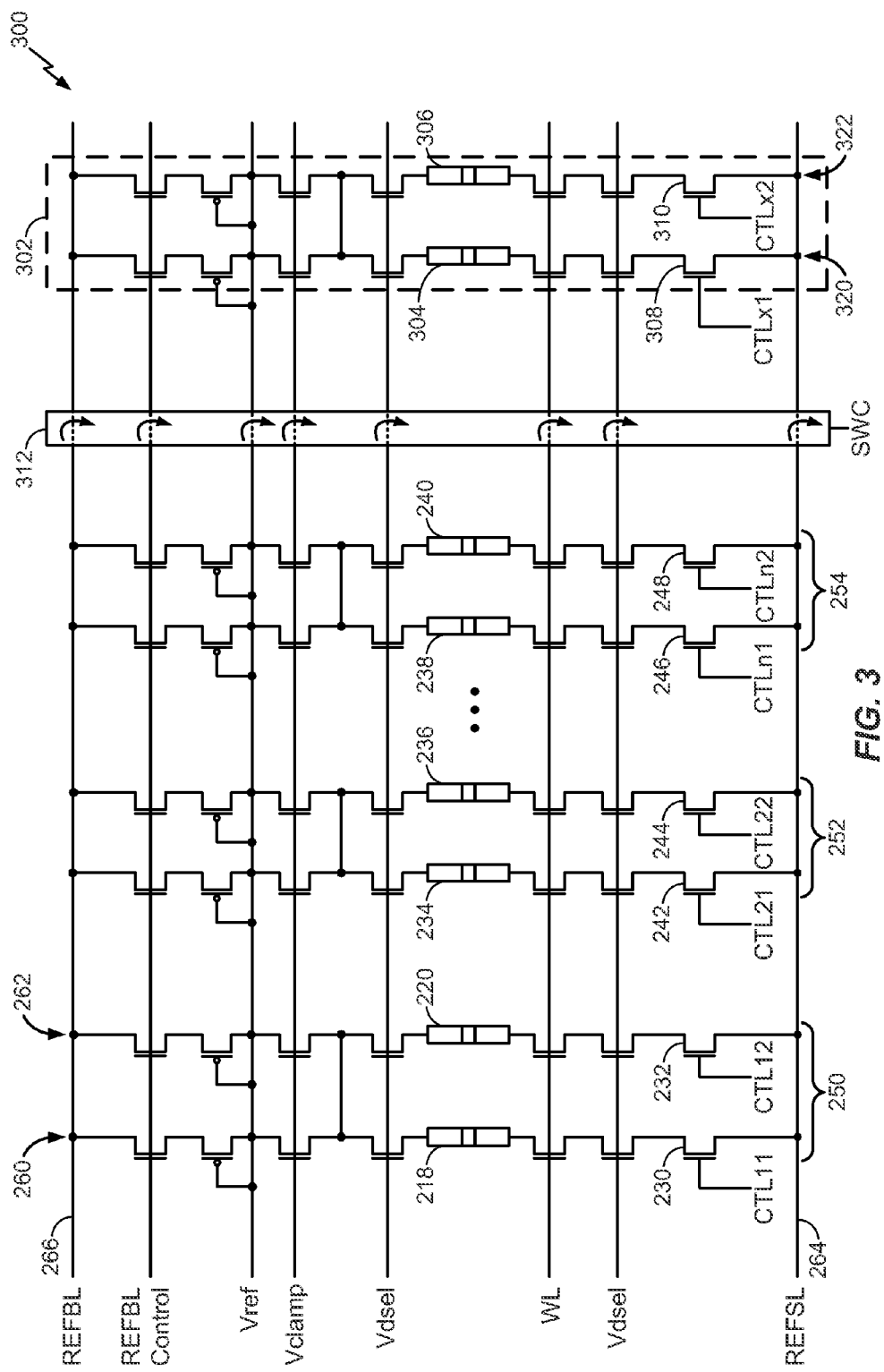
FIG. 3 is a circuit diagram of another particular illustrative embodiment of the tunable reference circuit.

Referring to FIG. 3, a particular illustrative embodiment of a tunable reference circuit is depicted and generally designated 300. The tunable reference circuit 300 may provide a reference voltage (Vref) that is based on a reference resistance of the tunable reference circuit 300 for use in determining (sensing) a digital value corresponding to an output voltage of a memory element. The tunable reference circuit 300 may include the first reference pair 250, the second reference pair 252, the nth reference pair 254, a spare reference pair 302, and bank of switches 312. The first reference pair 250, the second reference pair 252, and the nth reference pair 254 may be coupled together in parallel. The spare reference pair 302 may be tied in parallel to the first reference pair 250, to the second reference pair 252, and to the nth reference pair 254 via the bank of switches 312. In a particular embodiment, the reference resistance of the tunable reference circuit 300 may be adjusted by adjusting the reference resistance of one or more of the first reference pair 250, the second reference pair 252, the nth reference pair 254, and the spare reference pair 302.

In a particular embodiment, the first reference pair 250, the second reference pair 252, and the nth reference pair 254 may correspond to the first reference pair 250, the second reference pair 252, and the nth reference pair 254 of FIG. 2.

In a particular embodiment, the bank of switches 312 may be configured to receive a switch control signal (SWC) to control the operation of switches in the bank of switches 312. For example, the switch control signal (SWC) may be asserted to close the switches in the bank of switches 312 to couple the spare reference pair 302 to the first reference pair 250, to the second reference pair 252, and to the nth reference pair 254. The switch control signal (SWC) may also be deasserted to open the switches in the bank of switches 312 to decouple the spare reference pair 302 from the first reference pair 250, the second reference pair 252, and the nth reference pair 254. In a particular embodiment, one or more of the switches in the switch bank 312 may be n-channel metal-oxide-semiconductor (NMOS) transistors, p-channel metal-oxide-semiconductor (PMOS) transistors, or complimentary metal-oxide-semiconductor (CMOS) transistors. For example, the switch control signal (SWC) may be provided to a gate terminal of each transistor in the bank of switches 312.

In a particular embodiment, the reference resistance of the tunable reference circuit 300 may be adjusted by adjusting the reference resistance of the spare reference pair 302. The spare reference pair 302 may have a similar structure as the first reference pair 250, the second reference pair 252, and the nth reference pair 254. For example, the spare reference pair 302 may include a first path 320 and a second path 322. The first path 320 may be configured receive the write current via the reference bit line 266 or via the reference source line 264. The spare reference pair 302 may include a first spare MTJ element 304 in the first path 320 and a second spare MTJ element 306 in the second path 322. The reference resistance of the tunable reference circuit 300 may be adjustable by adjusting a resistance of one or more of the first spare MTJ element 304 and the second spare MTJ element 306. For example, the reference resistance of the tunable reference circuit 300 may be adjustable by adjusting a resistance of the first spare MTJ element 304. To illustrate, the first spare reference source line control signal (CTLx1) may be provided to a gate terminal of a first spare transistor 308 in the first path 320. A second spare reference source line control signal (CTLx2) may be provided to a gate terminal of a second spare transistor 310 in the second path 322. The first path 320 may be selected by asserting the first spare reference source line control signal (CTLx1). Similarly, the second path 322 may be selected by asserting the second spare reference source line control signal (CTLx2). In a particular embodiment, the first path 320 may be configured to receive a current to set an MTJ resistance of the first spare MTJ element 304 in a similar manner as described with respect to the first path 260 in the first reference pair 250 of FIG. 2. The second path 322 may be configured to receive a current to set an MTJ resistance of the second spare MTJ element 306 in a similar manner as described with respect to the second path 262 in the first reference pair 250 of FIG. 2.

In a particular embodiment, the resistance of one or more of the first spare MTJ element 304 and the second spare MTJ element 306 may be adjusted such that a number of MTJ elements in the tunable reference circuit 300 having a low resistance (Rp) (e.g., in a parallel state) is different from a number of MTJ elements in the tunable reference circuit 300 having a high resistance (Rap) (e.g., in an anti-parallel state). In another particular embodiment, the resistance of one or more of the first spare MTJ element 304 and the second spare MTJ element 306 may be adjusted such that a number of MTJ elements in the tunable reference circuit 300 having a low resistance (Rp) (e.g., in a parallel state) is equal to a number of MTJ elements in the tunable reference circuit 300 having a high resistance (Rap) (e.g., in an anti-parallel state).

In a particular embodiment, the spare reference pair 302 may be included in an array of reference pairs that includes the first reference pair 250 and the second reference pair 252. In an alternative embodiment, the spare reference pair 302 may be external to the array of reference pairs that includes the first reference pair 250 and the second reference pair 252. In another particular embodiment, the spare reference pair 302 may include only the first path 320.

During operation, the reference resistance of the tunable reference circuit 300 may be adjusted by adjusting the resistance of one or more of the first reference pair 250, the second reference pair 252, the nth reference pair 254, and the spare reference pair 302. For example, the resistance of one or more of the first reference pair 250, the second reference pair 252, the nth reference pair 254, and the spare reference pair 302 may be adjusted such that a number of MTJ elements having a low resistance (Rp) is different from a number of MTJ elements having a high resistance (Rap). To illustrate, the switch control signal (SWC) may be asserted to couple the spare reference pair 302 to the first reference pair 250, the second reference pair 252, and the nth reference pair 254. To adjust the resistance of the spare reference pair 302, the spare reference source line control signal (CNTLx1) may be asserted to select the first path 320. The word line signal (WL), the data select signal (Vdsel), the voltage clamp signal (Vclamp), and the reference bit line control signal (REFBL control) may be asserted to turn on transistors in the spare reference pair 302. A write current may be applied to the first path 320 to set the resistance of the first spare MTJ element 304 to a low resistance (Rp) or to a high resistance (Rap). The resistance of the second spare MTJ element 306 may be adjusted in a similar manner as described with respect to the first spare MTJ element 304.

Following the adjustment of the reference resistance of the tunable reference circuit 300, the reference voltage (Vref) corresponding to the reference resistance of the tunable reference circuit 300 may be used to determine (sense) a digital value corresponding to an output voltage of an MTJ memory element, as described with respect to FIG. 2.

By coupling the spare reference pair 302 to the first reference pair 250, to the second reference pair 252, and to the nth reference pair 254 and adjusting the resistance of the spare reference pair 302, the reference resistance of the tunable reference circuit 300 may be adjusted. The reference voltage (Wet) may be correspondingly adjusted higher or lower as a result of adjusting the reference resistance of the tunable reference circuit 300. Adjustment of the reference voltage (Vref) may improve the reliability of a digital value corresponding to an output voltage of an MTJ memory element that is determined (sensed) based on the output voltage of the MIT memory element and the reference voltage (Vref). In addition, manufacturing yield of memory devices that include the MTJ memory element may be improved as a result of compensating for process variations and manufacturing defects by adjusting the reference resistance of the tunable reference circuit 300. Adjusting a specific reference pair based on an optimizing algorithm will improve overall sensing margin for all MTJ elements in a memory device and also improve sensing margin for particular MTJ memory elements in the memory device. Such improvements in sensing margin may improve manufacturing yield of MRAM devices.

Although FIG. 3 illustrates three reference pairs 250, 252, 254, the tunable reference circuit 300 may include greater than or less than three reference pairs. In addition, although a single pair of spare reference pair 302 is illustrated, more than one spare reference pairs may be configured to be coupled to the first, second, and nth reference pairs 250, 252, 254.

Figure 4:
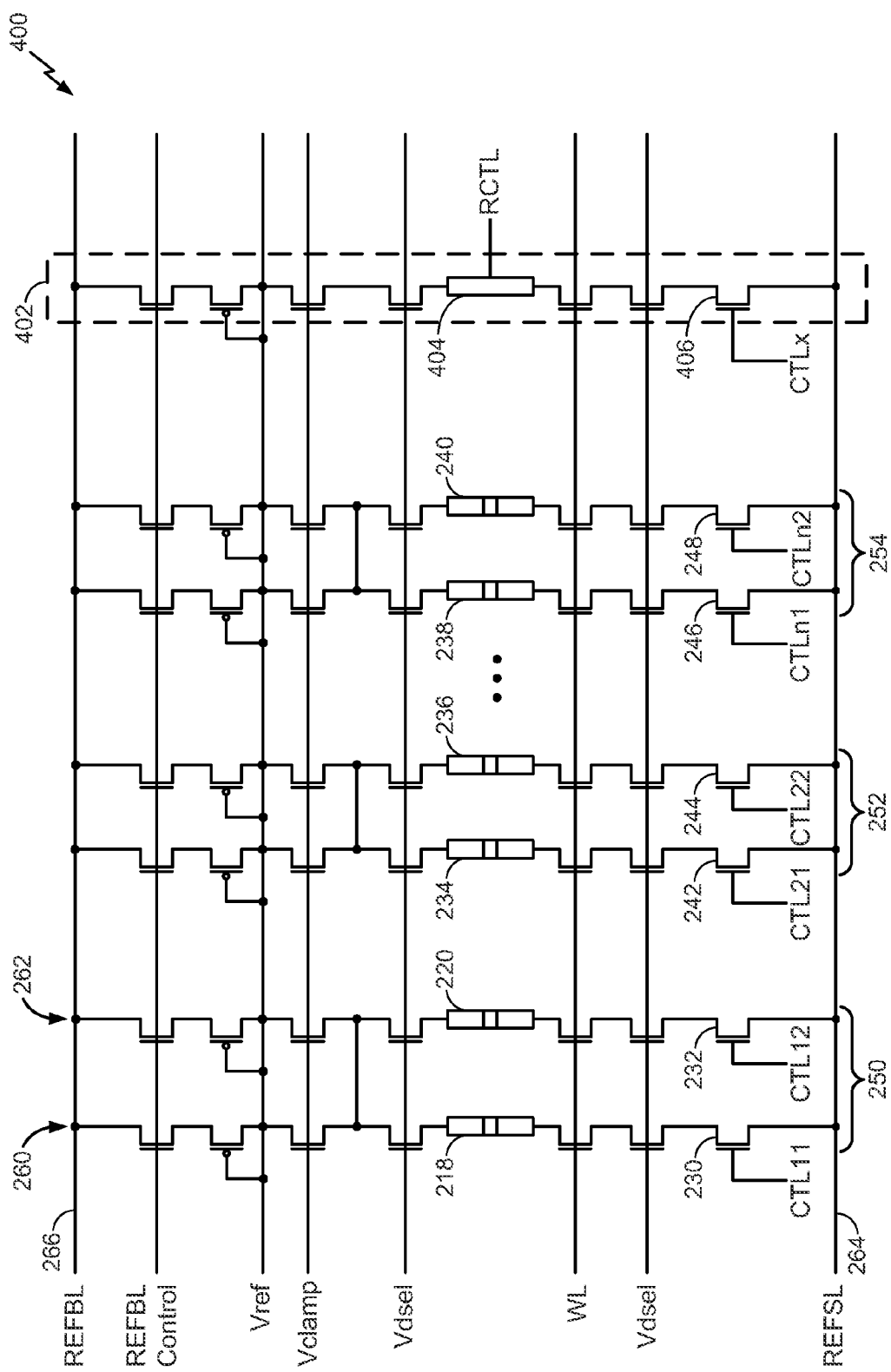
FIG. 4 is a circuit diagram of another particular illustrative embodiment of the tunable reference circuit.

Referring to FIG. 4, a particular illustrative embodiment of a tunable reference circuit is depicted and generally designated 400. The tunable reference circuit 400 may provide a reference voltage (Vref) that is based on a reference resistance of the tunable reference circuit 400 for use in determining a digital value corresponding to an output voltage of a memory element. The tunable reference circuit 400 may include the first reference pair 250, the second reference pair 252, the nth reference pair 254, and a reference block 402. The first reference pair 250, the second reference pair 252, and the nth reference pair 254 may be coupled together in parallel. The reference block 402 may be tied in parallel to the first reference pair 250, to the second reference pair 252, and to the nth reference pair 254. In a particular embodiment, the reference resistance of the tunable reference circuit 400 may be adjusted by adjusting a reference resistance of one or more of the first reference pair 250, the second reference pair 252, the nth reference pair 254, and the reference block 402.

In a particular embodiment, the first reference pair 250, the second reference pair 252, and the nth reference pair 254 may correspond to the first reference pair 250, the second reference pair 252, and the nth reference pair 254 of FIG. 2 and FIG. 3 and may operate as described with respect to FIG. 2 and FIG. 3. In a particular embodiment, each of the first reference pair 250, the second reference pair 252, and the nth reference pair 254 may include a respective first MTJ element having a low resistance (Rp) in a parallel state) and a respective second MTJ element having a high resistance (Rap) (e.g., in an anti-parallel state).

In a particular embodiment, the reference resistance of the tunable reference circuit 400 may be adjusted by adjusting a reference resistance of the reference block 402. The reference block 402 may include an adjustable resistor network 404 that is configured to receive a resistance control signal (RCTL). The resistance of the adjustable resistor network 404 may be adjusted by adjusting the resistance control signal (RCTL). The reference block 402 may be configured to receive current via the reference bit line 266 or via the reference source line 264. To enable a current to pass through the adjustable resistor network 404, a reference source line control signal (CTLx) may be provided to a gate terminal of a transistor 406.

During operation, the reference resistance of the tunable reference circuit 400 may be adjusted by adjusting the resistance of one or more of the first reference pair 250, the second reference pair 252, the nth reference pair 254, and the reference block 402. To illustrate, the resistance of the reference block 402 may be adjusted to increase or decrease the reference resistance of the tunable reference circuit 400. The resistance of the reference block 402 may be adjusted by adjusting the resistance control signal (RCTL) to increase or decrease the resistance of the adjustable resistor network 404.

Following the adjustment of the reference resistance of the tunable reference circuit 400, the reference voltage (Vref) corresponding to the reference resistance of the tunable reference circuit 400 may be used to determine a digital value corresponding to an output voltage of an MTJ memory element, as described with respect to FIG. 2 and FIG. 3.

By adjusting the resistance of the reference block 402, the reference resistance of the tunable reference circuit 400 may be adjusted. The reference voltage (Wet) may be correspondingly adjusted higher or lower as a result of adjusting the reference resistance of the tunable reference circuit 400. Adjustment of the reference voltage (Vref) may improve the reliability of a digital value corresponding to an output voltage of an MTJ memory element that is determined (sensed) based on the output voltage of the MTJ memory element and the reference voltage (Vref). In addition, manufacturing yield of memory devices that include the MTJ memory element may be improved as a result of compensating for process variations and manufacturing defects by adjusting the reference resistance of the tunable reference circuit 400. Adjusting a specific reference pair based on an optimizing algorithm will improve overall sensing margin for all MTJ elements in a memory device and also improve sensing margin for particular MTJ memory elements in the memory device. Such improvements in sensing margin may improve manufacturing yield of MRAM devices.

Figure 5:
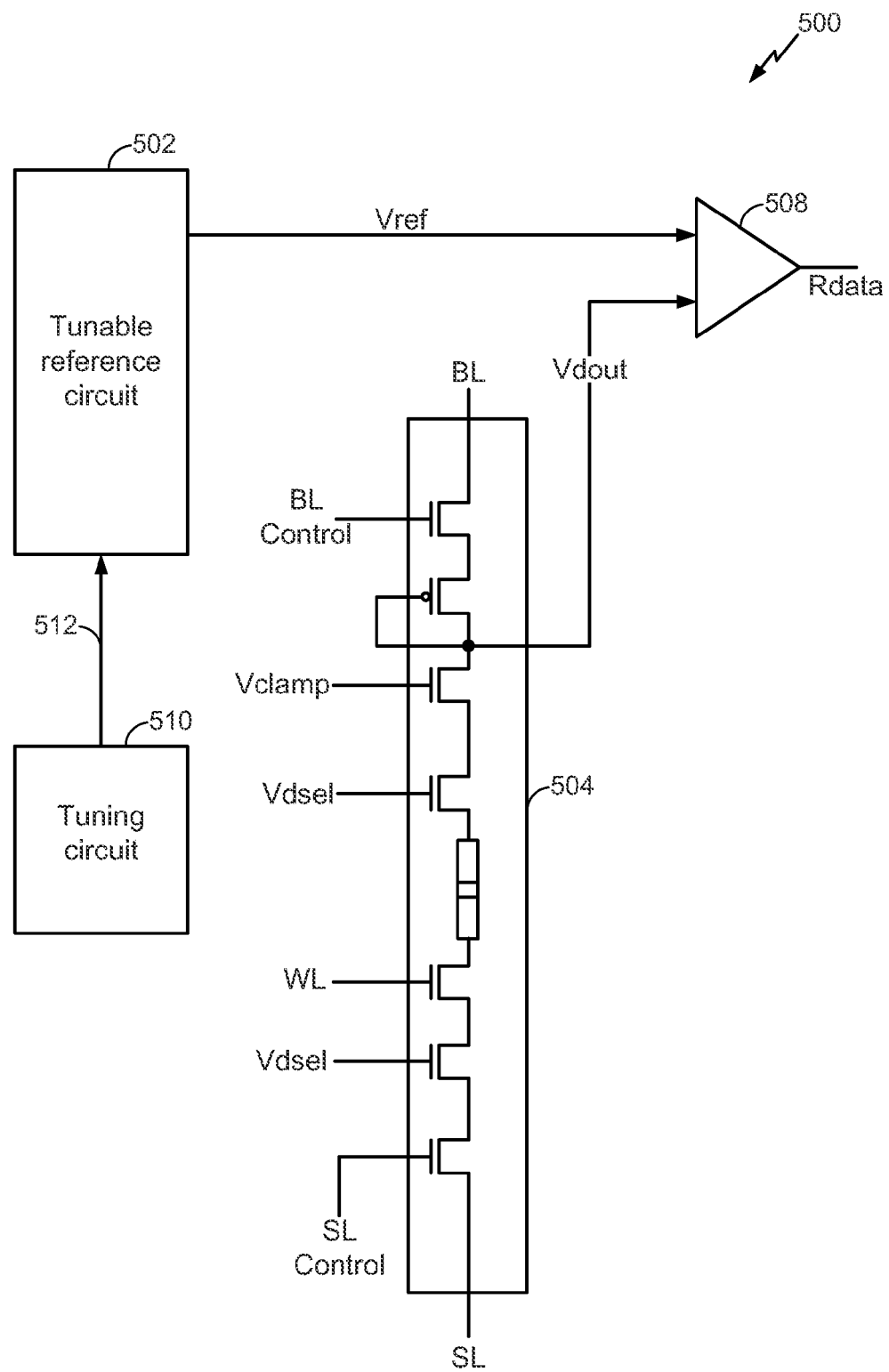
FIG. 5 is a block diagram of a particular illustrative embodiment of a system including the tunable reference circuit of FIGS. 1-4 to determine a digital value corresponding to an output of a memory element.

Referring to FIG. 5, a particular illustrative embodiment of a system including a tunable reference circuit is depicted and generally designated 500. The system 500 may be configured to determine (sense) a digital value corresponding to an output voltage (Vdout) of a memory element 504.

The system 500 includes a tunable reference circuit 502, the memory element 504, a sensing device 508 (e.g., a sense amplifier), and a tuning circuit 510. The tuning circuit 510 may be coupled to the tunable reference circuit 502 via a tuning line 512. The tunable reference circuit 502 may be coupled to a first input of the sensing device 508 to provide the reference voltage (Wet) to the sensing device 508. The memory element 504 may be coupled to a second input of the sensing device 508 to provide an output voltage (Vdout) to the sensing device 508.

The tuning circuit 510 may adjust the reference resistance of the tunable reference circuit 502 as described with respect to FIGS. 1-4. For example, the tuning circuit 510 may adjust the reference resistance of the tunable reference circuit 502 to increase or decrease the reference resistance. The reference voltage (Vref) may be adjusted corresponding to the reference resistance adjustment. In a particular embodiment, the tunable reference circuit 502 may correspond to any of the tunable reference circuit 100 of FIG. 1, the tunable reference circuit 200 of FIG. 2, the tunable reference circuit 300 of FIG. 3, and the tunable reference circuit 400 of FIG. 4.

The memory element 504 may be configured to provide the output voltage (Vdout) corresponding to a digital value. For example, the memory element 504 may be programmed to have a first resistance (e.g., low resistance (Ra)) corresponding to a first digital value. Alternatively, the memory element 504 may be programmed to have a second resistance (e.g., a high resistance (Rap)) corresponding to a second digital value. The memory element 504 may be configured to provide the output voltage (Vdout) during a read operation. In a particular embodiment, the memory element 504 may be an MTJ memory element.

The sensing device 508 is configured to determine a digital value corresponding to the output voltage (Vdout) of the memory element 504. The sensing device 508 may determine whether the output voltage (Vdout) corresponds to the first digital value or to the second digital value based on the reference voltage (Vref).

In a particular embodiment, the tuning circuit 510 or another circuit (not shown) may be configured to program the memory element 504 to have a first resistance that corresponds to the first digital value. The tuning circuit 510 or another circuit (not shown) may be configured to receive an output signal (rdata) of the sensing device 508 to determine (sense) whether the output signal (rdata) corresponds to the first digital value. If the output signal (rdata) fails to correspond to the first digital value, the tuning circuit 510 may adjust the reference resistance of the tunable reference circuit 502 to correspondingly adjust the reference voltage (Vref). The tuning circuit 510 may repeatedly adjust the reference resistance of the tunable reference circuit 502 until the output signal (rdata) correspond to the first digital value. The tuning of the tunable reference circuit 502 may also be performed based on the second digital value to find a reference resistance of the tunable reference circuit 502 that enables a reliable determination (sensing) of both the first digital value and the second digital value.

During operation, the tuning circuit 510 may tune the tunable reference circuit 502 to adjust the reference resistance of the tunable reference circuit 502. Following the tuning of the tunable reference circuit 502, a read operation may be performed on the memory element 504. During the read operation, the sensing device 508 may determine whether the output voltage (Vdata) corresponds to the first digital value or to the second digital value.

By tuning the tunable reference circuit 502 to adjust the reference resistance of the tunable reference circuit 502, the reference voltage (Vref) is correspondingly adjusted. Adjustment of the reference voltage (Vref) may improve the reliability of the digital value that is determined (sensed) to correspond to the output voltage (Vdata) of the memory element. In addition, manufacturing yield of memory devices that include the memory element 504 may be improved as a result of compensating for process variations and manufacturing defects by adjusting the reference resistance of the tunable reference circuit 502.

Although FIG. 5 illustrates one memory element 504 coupled to the second input of the sensing device 508, the system 500 may include more than one memory element that may be selectively coupled to the second input of the sensing device 508.

Figure 6:
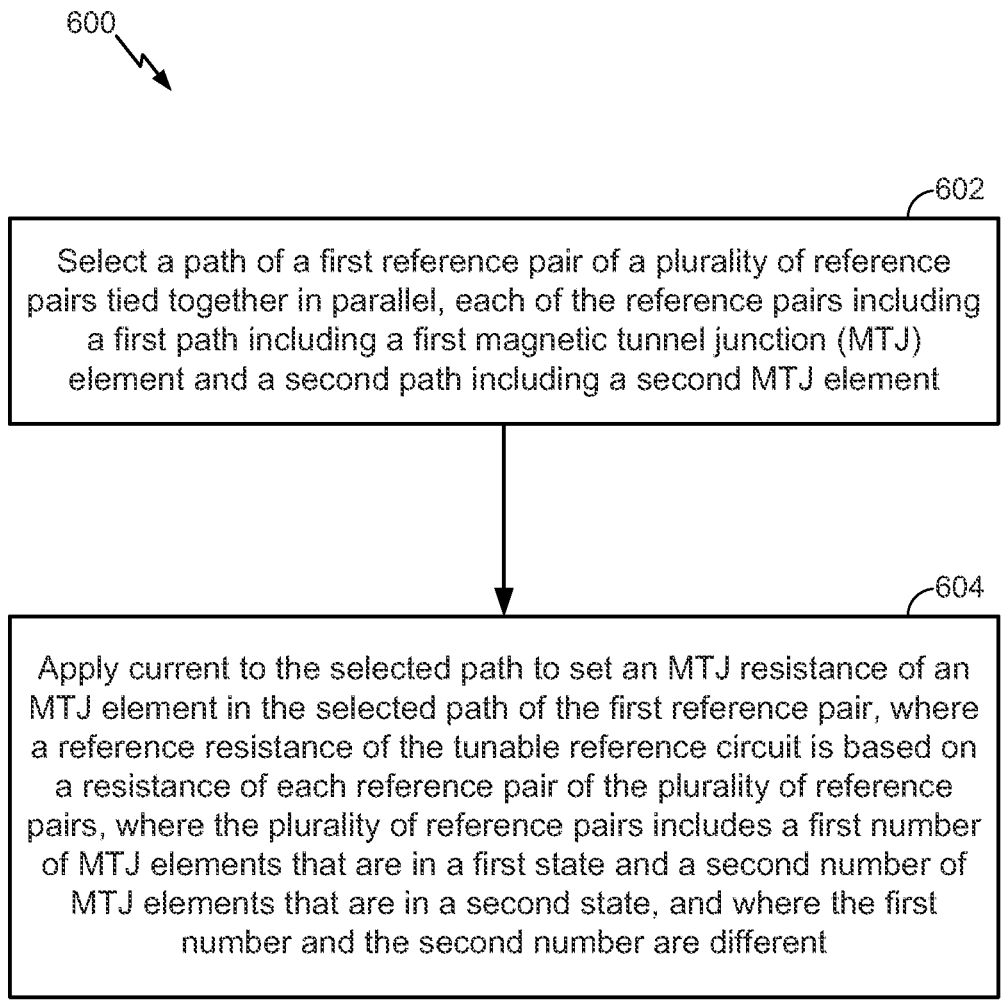
FIG. 6 is a flow chart of a particular illustrative embodiment of a method of adjusting a tunable reference circuit.

Referring to FIG. 6, a particular illustrative embodiment of a method of tuning a tunable reference circuit is illustrated. The method 600 includes selecting a path of a first reference pair of a plurality of reference pairs tied together in parallel, at 602. For example, the first reference pair 102 and the second reference pair 104 of FIG. 1 are tied together in parallel. The first path 106 of the first reference pair 102 of FIG. 1 may be selected. Similarly, the first reference pair 250, the second reference pair 252, and the nth reference pair 254 of FIG. 2 are tied together in parallel. The first path 260 of the first reference pair 250 of FIG. 2 may be selected by asserting the first control signal (CNTL11) of FIG. 2. Each of the reference pairs may include a first path that includes a first magnetic tunnel junction (MTJ) element and a second path including a second MTJ element. For example, the first reference pair 102 of FIG. 1 includes the first path 106 that includes the first MTJ element 110. The first reference pair 102 of FIG. 1 also includes the second path 108 that includes the second MTJ element 112. The second reference pair 104 of FIG. 1 includes the first path 114 that includes the first MTJ element 118. The second reference pair 104 of FIG. 1 also includes the second path 116 that includes the second MTJ element 120. Similarly, each of the first reference pair 250, the second reference pair 252, and the nth reference pair 254 of FIG. 2 include a first path and a second path that include a corresponding MTJ element.

The method 600 further includes applying current to the selected path to set an MTJ resistance of an MTJ element in the selected path of the first reference pair, at 604. For example, the current may be applied to the first path 106 of the first reference pair 102 of FIG. 1. Similarly, the current may be applied to the first path 260 of the first reference pair 250 of FIG. 2. A reference resistance of the tunable reference circuit may be based on a resistance of each reference pair of the plurality of reference pairs. For example, the reference resistance of the tunable reference circuit 100 of FIG. 1 may be based on the resistance of each of the first reference pair 102 and the second reference pair 104. Similarly, the reference resistance of the tunable reference circuit 200 of FIG. 2 may be based on the resistance of each of the first reference pair 250, the second reference pair 252, and the nth reference pair 254. The plurality of reference pairs may include a first number of MTJ elements that are in a first state and a second number of MTJ elements that are in a second state. The first number and the second number may be different. For example, the number of the MTJ elements 110, 112, 118, 120 of FIG. 1 that are in the first state (e.g., a parallel state) may be different from the number of the MTJ elements 110, 112, 118, 120 that are in the second state e.g., an anti-parallel state).

The method 600 of FIG. 6 may be implemented by an application-specific integrated circuit (ASIC), a field-programmable gate array (FPGA) device, a processing unit such as a central processing unit (CPU), a digital signal processor (DSP), a controller, another hardware device, a firmware device, or any combination thereof. As an example, the method of FIG. 6 can be performed by or in response to signals or commands from a processor that executes instructions, as described with respect to FIG. 7.

Figure 7:
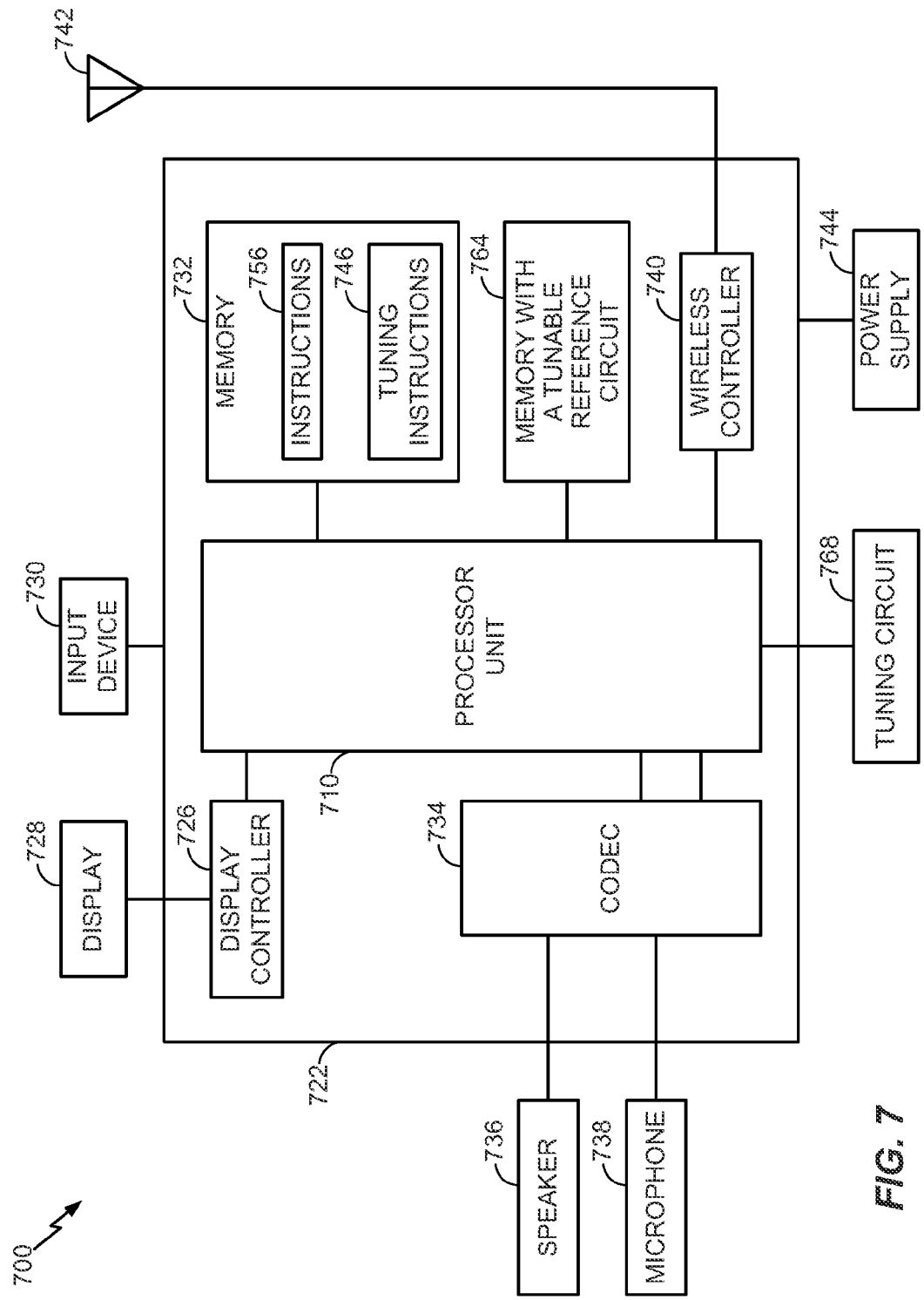
FIG. 7 is a diagram of wireless device including a memory with a tunable reference circuit.

Referring to FIG. 7, a block diagram of a particular illustrative embodiment of a wireless communication device is depicted and generally designated 700. The wireless communication device 700 includes a processor unit 710, such as a digital signal processor (DSP), coupled to a memory 732. The wireless communication device 700 may include a memory with a tunable reference circuit 764. In an illustrative embodiment, the memory with the tunable reference circuit 764 may correspond to the circuit 100 of FIG. 1, the circuit 200 of FIG. 2, the circuit 300 of FIG. 3, the circuit 400 of FIG. 4, and the tunable reference circuit 502 of FIG. 5, or may operate according to the method of FIG. 6, or any combination thereof.

The memory 732 may be a non-transitory computer readable medium storing computer-executable instructions 746 that are executable by the processor unit 710 (e.g. a computer) to cause the processor unit 710 to select a path of a first reference pair of a plurality of reference pairs tied together in parallel. For example, the tuning instructions 746 may include instructions to select a path of a first reference pair of a plurality of reference pairs that are inside the memory with a tunable reference circuit 764 and tied together in parallel. Each of the reference pairs may include a first path including a first magnetic tunnel junction (MTJ) element and a second path including a second MTJ element. Additionally, the computer-executable instructions 746 may include instructions that are executable by the processor unit 710 to cause the processor unit 710 to apply current to the selected path to set an MTJ resistance of an MTJ element in the selected path of the first reference pair. For example, the tuning instructions 746 may include instructions to apply current to the selected path to set an MTJ resistance of an MTJ element in the selected path of the first reference pair that is inside the memory with a tunable reference circuit 764. A reference resistance of the tunable reference circuit is based on a resistance of each reference pair of the plurality of reference pairs. The plurality of reference pairs may include a first number of MTJ elements that are in a first state and a second number of MTJ elements that are in a second state. The first number and the second number may be different.

FIG. 7 also shows a display controller 726 that is coupled to the processor unit 710 and to a display 728. A coder/decoder (CODEC) 734 can also be coupled to the processor unit 710. A speaker 736 and a microphone 738 can be coupled to the CODEC 734.

FIG. 7 indicates that a wireless controller 740 can be coupled to the processor unit 710 and to a wireless antenna 742. In a particular embodiment, the processor unit 710, the memory with the tunable reference circuit 764, the display controller 726, the memory 732, the CODEC 734, and the wireless controller 740 are included in a system-in-package or system-on-chip device 722. In a particular embodiment, an input device 730 and a power supply 744 are coupled to the system-on-chip device 722. Moreover, in a particular embodiment, as illustrated in FIG. 7, the display 728, the input device 730, the speaker 736, the microphone 738, the wireless antenna 742, and the power supply 744 are external to the system-on-chip device 722. However, each of the display 728, the input device 730, the speaker 736, the microphone 738, the wireless antenna 742, and the power supply 744 can be coupled to a component of the system-on-chip device 722, such as an interface or a controller.

In a particular embodiment, a tuning circuit 768 may be coupled to the processor unit 710. The tuning circuit 768 and the processor unit 710 may operate to adjust a reference resistance of the tunable reference circuit inside the memory with a tunable reference circuit 764. In a particular embodiment, the tuning circuit 768 may be used in conjunction with the tuning instructions 746. Alternatively, the tuning circuit 768 may operate independently of the tuning instructions 746 or with a memory that does not include tuning instructions.

While FIG. 7 illustrates a particular embodiment of a wireless device 700, one or more memories (e.g., the memory with the tunable reference circuit 764) may be integrated in other electronic devices including a set top box, a music player, a video player, an entertainment unit, a navigation device, a communications device, a personal digital assistant (PDA), a fixed location data unit, and a computer.

In conjunction with the described embodiments, a system is disclosed that may include means for selecting a path of a first reference pair of a plurality of reference pairs tied together in parallel, each of the reference pairs including a first path including a first magnetic tunnel junction (NTH) element and a second path including a second. MTJ element. For example, the means for selecting a path may include the transistors 230, 232, 242, 244, 246, and 248 of FIG. 2, the transistors 230, 232, 242, 244, 246, 248, 308, and 310 of FIG. 3, the transistors 230, 232, 242, 244, 246, and 248 of FIG. 4, one or more other devices or circuits configured to select a path, or any combination thereof. The system may also include means for applying current to the selected path to set an MTJ resistance of an MTJ element in the selected path of the first reference pair, where a reference resistance of the tunable reference circuit is based on a resistance of each reference pair of the plurality of reference pairs, where the plurality of reference pairs includes a first number of MTJ elements that are in a first state and a second number of elements that are in a second state, and where the first number and the second number are different. The means for applying current to the selected path may include the reference bit line 266 of FIG. 2, reference source line 264 of FIG. 2, the reference bit line 266 of FIG. 3, reference source line 264 of FIG. 4, the reference bit line 266 of FIG. 4, reference source line 264 of FIG. 4, one or more other devices or circuits configured to apply current to the selected path, or any combination thereof.

Figure 8:
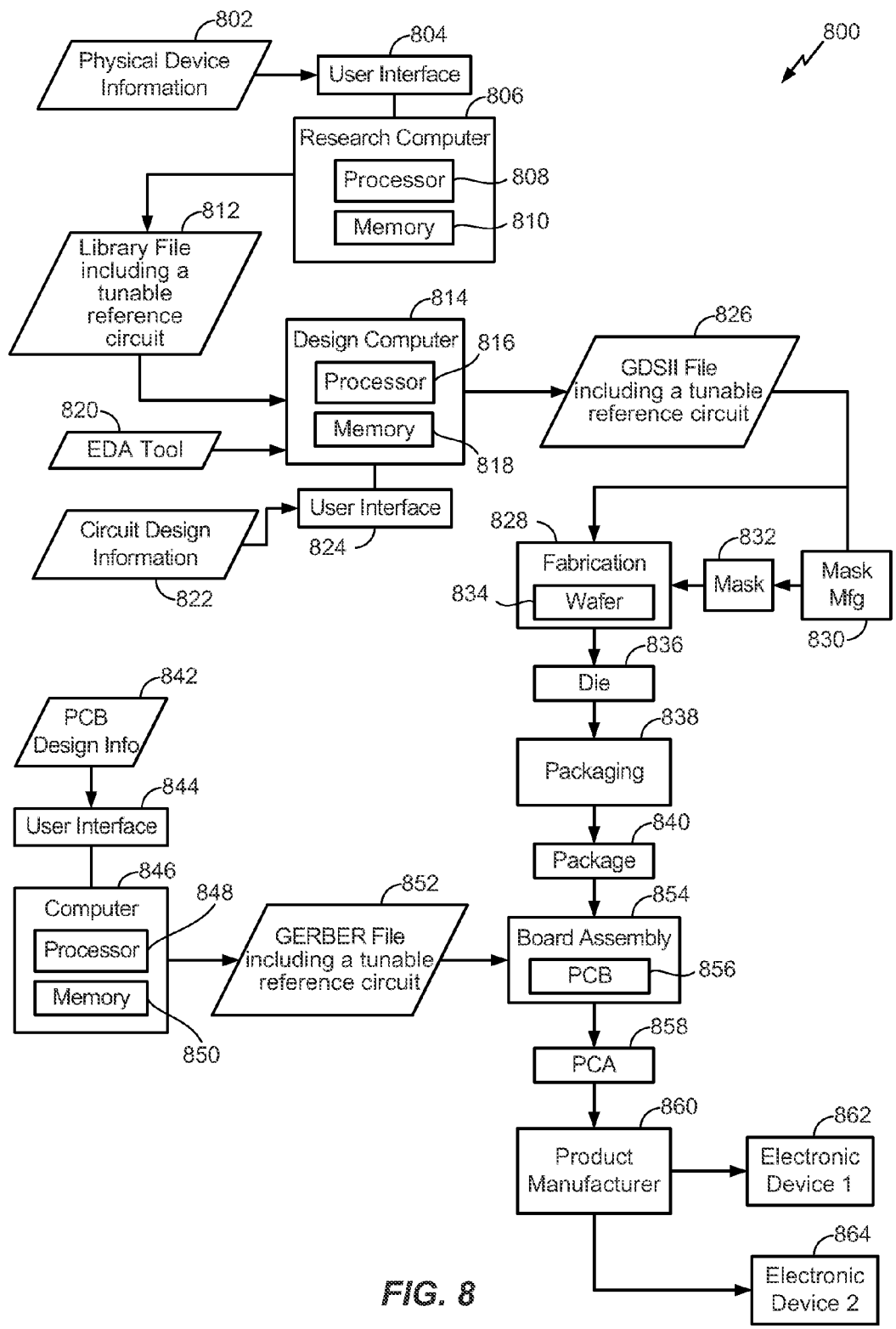
FIG. 8 is a data flow diagram of a particular illustrative embodiment of a manufacturing process to manufacture electronic devices that include a tunable reference circuit.

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received at the manufacturing process 800, such as at a research computer 806. The physical device information 802 may include design information representing at least one physical property of a semiconductor device, such as a semiconductor device that includes the circuit 100 of FIG. 1, the circuit 200 of FIG. 2, the circuit 300 of FIG. 3, the circuit 400 of FIG. 4, the system of FIG. 5, or any combination thereof. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including a device that includes the circuit 100 of FIG. 1, the circuit 200 of FIG. 2, the circuit 300 of FIG. 3, the circuit 400 of FIG. 4, and the system of FIG. 5, or any combination thereof, that is provided for use with an electronic design automation (FDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit including the circuit 100 of FIG. 1, the circuit 200 of FIG. 2, the circuit 300 of FIG. 3, the circuit 400 of FIG. 4, and the system of FIG. 5, or any combination thereof, of the library file 812. For example, a user of the design computer 814 may enter circuit design information 822 via a user interface 824 coupled to the design computer 814. The circuit design information 822 may include design information representing at least one physical property of a semiconductor device, such as a device including the circuit 100 of FIG. 1, the circuit 200 of FIG. 2, the circuit 300 of FIG. 3, the circuit 400 of FIG. 4, and the system of FIG. 5, or any combination thereof. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the circuit 100 of FIG. 1, the circuit 200 of FIG. 2, the circuit 300 of FIG. 3, the circuit 400 of FIG. 4, and the system of FIG. 5, or any combination thereof, in addition to other circuits or information. To illustrate, the data file may include information corresponding to a system-on-chip (SOC) that includes the circuit 100 of FIG. 1, the circuit 200 of FIG. 2, the circuit 300 of FIG. 3, the circuit 400 of FIG. 4, and the system of FIG. 5, and that also includes additional electronic circuits and components within the SOC.

The GDSII file 826 may be received at a fabrication process 828 to manufacture the circuit 100 of FIG. 1, the circuit 200 of FIG. 2, the circuit 300 of FIG. 3, the circuit 400 of FIG. 4, and the system of FIG. 5, or any combination thereof, according to transformed information in the GDSII file 826. For example, a device manufacture process may include providing the GDSII file 826 to a mask manufacturer 830 to create one or more masks, such as masks to be used with photolithography processing, illustrated as a representative mask 832. The mask 832 may be used during the fabrication process to generate one or more wafers 834, which may be tested and separated into dies, such as a representative die 836. The die 836 includes circuits that include the circuit 100 of FIG. 1, the circuit 200 of FIG. 2, the circuit 300 of FIG. 3, the circuit 400 of FIG. 4, and the system of FIG. 5, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed, to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via user interface 844. The PCB design information 842 may include physical positioning information of a packaged semiconductor device on a circuit board, the packaged semiconductor device corresponding to the package 840 including the circuit 100 of FIG. 1, the circuit 200 of FIG. 2, the circuit 300 of FIG. 3, the circuit 400 of FIG. 4, the system of FIG. 5, or any combination thereof.

The computer 846 may be configured to transform the PCB design information 842 to generate a data file, such as a GERBER file 852, with data that includes physical positioning information of a packaged semiconductor device on a circuit board, as well as layout of electrical connections such as traces and vias, where the packaged semiconductor device corresponds to the package 840 including the circuit 100 of FIG. 1, the circuit 200 of FIG. 2, the circuit 300 of FIG. 3, the circuit 400 of FIG. 4, and the system of FIG. 5, or any combination thereof. In other embodiments, the data file generated by the transformed PCB design information may have a format other than a GERBER format.

The GERBER file 852 may be received at a board assembly process 854 and used to create PCBs, such as a representative PCB 856 manufactured in accordance with the design information stored within the GERBER file 852. For example, the GERBER file 852 may be uploaded to one or more machines to perform various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer, into which the circuit 100 of FIG. 1, the circuit 200 of FIG. 2, the circuit 300 of FIG. 3, the circuit 400 of FIG. 4, and the system of FIG. 5, or any combination thereof is integrated. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 8 illustrates remote units according to teachings of the disclosure, the disclosure is not limited to these illustrated units. Embodiments of the disclosure may be suitably employed in any device that includes active integrated circuitry including memory and on-chip circuitry.

A device that includes the circuit 100 of FIG. 1, the circuit 200 of FIG. 2, the circuit 300 of FIG. 3, the circuit 400 of FIG. 4, and the system of FIG. 5, or any combination thereof, may be fabricated, processed, and incorporated into an electronic device, as described in the illustrative process 800. One or more aspects of the embodiments disclosed with respect to FIGS. 1-7 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited, to the embodiments shown herein but is to be accorded, the widest scope possible consistent with the principles and novel features as defined by the following claims.

What is claimed is:

1. A method of tuning a tunable reference circuit, the method comprising:
   selecting a path of a first reference pair of a plurality of reference pairs tied together in parallel, each of the reference pairs including a first path including a first magnetic tunnel junction (MTJ) element and a second path including a second MTJ element; and
   applying current to the selected path to set an MTJ resistance of an MTJ element in the selected path of the first reference pair, wherein a reference resistance of the tunable reference circuit is based on a resistance of each reference pair of the plurality of reference pairs, wherein the plurality of reference pairs includes a first number of MTJ elements that are in a first state and a second number of MTJ elements that are in a second state, and wherein the first number and the second number are different.

2. The method of claim 1, further comprising comparing an output voltage of a memory element to a reference voltage of the tunable reference circuit to determine a digital value corresponding to the output voltage of the memory element, wherein the reference voltage of the tunable reference circuit is based on the reference resistance of the tunable reference circuit.

3. The method of claim 1, wherein the reference resistance of the tunable reference circuit is an average of the resistance of each reference pair of the plurality of reference pairs and wherein the first state corresponds to a parallel-state and the second state corresponds to an anti-parallel state.

4. The method of claim 1, wherein a first resistance of the MTJ element in the selected path of the first reference pair corresponds to the first state of the MTJ element, wherein a second resistance of the MTJ element in the selected path of the first reference pair corresponds to the second state of the MTJ element, and wherein the second resistance is greater than the first resistance.

5. The method of claim 1, wherein the path of the first reference pair of the plurality of reference pairs is selected based on information on spatial location of the first and the second MTJ elements in each reference pair and based on variations in the resistances of the first and the second MTJ elements in each reference pair.

6. The method of claim 1, further comprising asserting at least one control signal to enable adequate current to flow through the MTJ element in the selected path of the first reference pair.

7. The method of claim 6, wherein the first path includes a first transistor, wherein the second path includes a second transistor, wherein a first control signal is provided to a gate terminal of the first transistor, and wherein a second control signal is provided to a gate terminal of the second transistor.

8. A circuit comprising:
a first reference pair including a first path and a second path, the first path including a first magnetic tunnel junction (MTJ) element and the second path including a second MTJ element; and
a second reference pair including a third path and a fourth path, the third path including a third MTJ element and the fourth path including a fourth MTJ element,
wherein the first reference pair and the second reference pair are tied together in parallel, wherein a reference resistance of the circuit is based on a resistance of each of the first, second, third, and fourth MTJ elements, wherein the reference resistance of the circuit is adjustable by adjusting a resistance of one of the first and second MTJ elements, wherein a first number of the first, the second, the third, and the fourth MTJ elements are in a first state, wherein a second number of the first, the second, the third, and the fourth MTJ elements are in a second state, and wherein the first number and the second number are different.

9. The circuit of claim 8, wherein an output voltage of a memory element is compared to a reference voltage corresponding to the reference resistance of the circuit to determine a digital value corresponding to the output voltage of the memory element.

10. A circuit comprising:
a first reference pair including a first path and a second path, the first path including a first magnetic tunnel junction (MTJ) element and the second path including a second MTJ element; and
a second reference pair including a third path and a fourth path, the third path including a third MTJ element and the fourth path including a fourth MTJ element, wherein the first reference pair and the second reference pair are coupled together in parallel, wherein a reference resistance of the circuit is based on a resistance of each of the first, second, third, and fourth MTJ elements, and wherein the reference resistance of the circuit is adjustable by adjusting a resistance of one of the first and second MTJ elements; and
a spare reference pair that is coupled in parallel to the first reference pair and to the second reference pair, the spare reference pair including a first spare MTJ element and a second spare MTJ element, wherein the reference resistance of the circuit is adjustable by adjusting a resistance of the first spare MTJ element, and wherein an output voltage of a memory element is compared to a reference voltage corresponding to the reference resistance of the circuit to determine a digital value corresponding to the output voltage of the memory element.

11. The circuit of claim 10, wherein the spare reference pair is included in an array of reference pairs, the array of reference pairs including the first reference pair and the second reference pair.

12. The circuit of claim 10, wherein the spare reference pair is external to an array of reference pairs, the array of reference pairs including the first reference pair and the second reference pair.

13. A circuit comprising:
a first reference pair including a first path and a second path, the first path including a first magnetic tunnel junction (MTJ) element and the second path including a second MTJ element; and
a second reference pair including a third path and a fourth path, the third path including a third MTJ element and the fourth path including a fourth MTJ element, wherein the first reference pair and the second reference pair are coupled together in parallel, wherein a reference resistance of the circuit is based on a resistance of each of the first, second, third, and fourth MTJ elements, and wherein the reference resistance of the circuit is adjustable by adjusting a resistance of one of the first and second MTJ elements; and
a reference block that is coupled in parallel to the first reference pair and to the second reference pair, wherein the reference block includes an adjustable resistor network, wherein the reference resistance of the circuit is adjustable by adjusting a resistance of the adjustable resistor network.

14. The circuit of claim 8, further comprising a memory path including a memory element that is tied in parallel to the first reference pair and to the second reference pair.

15. The circuit of claim 8, wherein the reference resistance of the circuit is adjusted after a self-test is performed on the circuit to determine initial resistance of the circuit.

16. The circuit of claim 8, wherein the reference resistance of the circuit is adjusted after a test is performed on the circuit to determine initial resistance of the circuit.

17. The circuit of claim 8, wherein the first path includes a first transistor, wherein a first control input is coupled to a gate terminal of the first transistor, wherein the second path includes a second transistor, wherein a second control input is coupled to a gate terminal of the second transistor, and wherein the first control input is different from the second control input.

18. The circuit of claim 8 integrated in at least one semiconductor die.

19. The circuit of claim 8, wherein the resistance of the one of the first reference pair and the second reference pair is adjusted based on spatial location information of the first reference pair and the second reference pair and based on variations in resistances of the first, second, third, and fourth MTJ elements.

20. The circuit of claim 8, further comprising a device selected from the group consisting of a set top box, a music player, a video player, an entertainment unit, a navigation device, a communications device, a personal digital assistant (PDA), a fixed location data unit, and a computer, into which the first reference pair and the second reference pair are integrated.

21. An apparatus comprising:
means for selecting a path of a first reference pair of a plurality of reference pairs tied together in parallel, each of the reference pairs including a first path including a first magnetic tunnel junction (MTJ) element and a second path including a second MTJ element; and
means for applying current to the selected path to set a resistance of an MTJ element in the selected path of the first reference pair, wherein a reference resistance of the apparatus is based on a resistance of each reference pair of the plurality of reference pairs, wherein the plurality of reference pairs includes a first number of MTJ elements that are in a first state and a second number of MTJ elements that are in a second state, and wherein the first number and the second number are different.

22. The apparatus of claim 21, further comprising means for comparing an output voltage of a memory element to the reference voltage of the tunable reference circuit to determine the state of the memory element.

23. The apparatus of claim 21, wherein the reference resistance of the tunable reference circuit is an average of the resistance of each reference pair of the plurality of reference pairs and wherein the first state corresponds to a parallel-state and the second state corresponds to an anti-parallel state.

24. The apparatus of claim 21, wherein a first resistance of the MTJ element in the selected path of the first reference pair corresponds to the first state of the MTJ element, wherein a second resistance of the MTJ element in the selected path of the first reference pair corresponds to the second state of the MTJ element, and wherein the second resistance is greater than the first resistance.

25. The apparatus of claim 21, wherein the path of the first reference pair of the plurality of reference pairs is selected based on information on spatial location of the first and the second MTJ elements in each reference pair and based on variations in the resistances of the first and the second MTJ elements in each reference pair.

26. A method comprising:
a step for selecting a path of a first reference pair of a plurality of reference pairs tied together in parallel, each of the reference pairs including a first path including a first magnetic tunnel junction (MTJ) element and a second path including a second MTJ element; and
a step for applying current to the selected path to set a resistance of an MTJ element in the selected path of the first reference pair, wherein a reference resistance of a tunable reference circuit is based on a resistance of each reference pair of the plurality of reference pairs, wherein the plurality of reference pairs includes a first number of MTJ elements that are in a first state and a second number of MTJ elements that are in a second state, and wherein the first number and the second number are different.

27. The method of claim 26, wherein selecting the first reference pair of the plurality of reference pairs is performed at a processor integrated into an electronic device.

28. The method of claim 26, wherein the path of the first reference pair of the plurality of reference pairs is selected based on information on spatial location of the first and the second MTJ elements in each reference pair and based on variations in the resistances of the first and the second MTJ elements in each reference pair.

29. A non-transitory computer readable tangible medium storing instructions executable by a computer, the instructions comprising:
instructions that are executable by the computer to select a path of a first reference pair of a plurality of reference pairs tied together in parallel, each of the reference pairs including a first path including a first magnetic tunnel junction (MTJ) element and a second path including a second MTJ element; and
instructions that are executable by the computer to apply current to the selected path to set a resistance of an MTJ element in the selected path of the first reference pair, wherein a reference resistance of a tunable reference circuit is based on a resistance of each reference pair of the plurality of reference pairs, wherein the plurality of reference pairs includes a first number of MTJ elements that are in a first state and a second number of MTJ elements that are in a second state, and wherein the first number and the second number are different.

30. The non-transitory computer readable tangible medium of claim 29, further comprising instructions that are executable by the computer to compare a resistance of a memory element to the reference resistance of the tunable reference circuit to determine the state of the memory element.

31. The non-transitory computer readable tangible medium of claim 29, wherein the path of the first reference pair of the plurality of reference pairs is selected based on information on spatial location of the first and the second MTJ elements in each reference pair and based on variations in the resistances of the first and the second MTJ elements in each reference pair.

32. A method comprising:
receiving a data file comprising design information corresponding to a semiconductor device; and
fabricating the semiconductor device according to the design information, wherein the semiconductor device comprises:
a first reference pair including a first path and a second path, the first path including a first magnetic tunnel junction (MTJ) element and the second path including a second MTJ element; and
a second reference pair including a third path and a fourth path, the third path including a third MTJ element and the fourth path including a fourth MTJ element,
wherein the first reference pair and the second reference pair are tied together in parallel, wherein a reference resistance of the circuit is based on a resistance of each of the first, second, third, and fourth MTJ elements, and wherein the reference resistance of the circuit is adjustable by adjusting a resistance of one of the first and second MTJ elements, wherein a first number of the first, the second, the third, and the fourth MTJ elements are in a first state, wherein a second number of the first, the second, the third, and the fourth MTJ elements are in a second state, and wherein the first number and the second number are different.

33. The method of claim 32, wherein the data file has a GDSII format.

34. The method of claim 32, wherein the data file has a GERBER format.

35. The method of claim 32, wherein the resistance of the one of the first reference pair and the second reference pair is adjusted based on spatial location information of the first reference pair and the second reference pair and based on variations in resistances of the first, second, third, and fourth MTJ elements.

36. The method of claim 2, further comprising adjusting the reference resistance of the tunable reference circuit by adjusting a resistance of a first spare MTJ element of a spare reference pair that includes the first spare MTJ element and a second spare MTJ element, and wherein the spare reference pair is coupled in parallel to the first reference pair and to a second reference pair.

* * * * *